United States Patent [19]

Tarui et al.

[11] 3,813,585

[45] May 28, 1974

[54] COMPOUND SEMICONDUCTOR DEVICE HAVING UNDERCUT ORIENTED GROOVE

[75] Inventors: Yasuo Tarui; Yoshio Komiya, both of Tokyo; Yasoo Harada, Aichi-ken, all of Japan

[73] Assignee: Agency of Industrial Science & Technology, Tokyo, Japan

[22] Filed: Apr. 27, 1971

[21] Appl. No.: 137,807

[30] Foreign Application Priority Data

Apr. 28, 1970 Japan ............................... 45-35904
Sept. 14, 1970 Japan ............................... 45-80325

[52] U.S. Cl............ 317/235 R, 156/17, 317/234 N, 317/234 V, 317/235 A, 317/235 G, 317/235 UA, 317/235 AJ

[51] Int. Cl. ........................................... H01l 19/00

[58] Field of Search......... 317/234 J, 234 N, 235 G, 317/235 A, 235 UA, 235 AJ, 235 B; 156/17

[56] References Cited

UNITED STATES PATENTS

| | | | |
|---|---|---|---|
| 3,359,462 | 12/1967 | Schütze et al. | 317/101 |
| 3,363,153 | 1/1968 | Zloczower | 317/235 B |
| 3,457,633 | 7/1969 | Marinace et al. | 29/583 |
| 3,493,820 | 2/1970 | Rosvold | 317/235 F |
| 3,528,168 | 9/1970 | Adamic | 29/571 |
| 3,551,220 | 12/1970 | Meer et al. | 148/175 |
| 3,607,448 | 9/1971 | Dunlap | 148/1.5 |
| 3,609,477 | 9/1971 | Drangeid et al. | 317/235 UA |
| 3,675,313 | 7/1972 | Driver et al. | 317/235 UA |
| 3,678,573 | 7/1972 | Driver | 317/235 A |
| 3,699,408 | 10/1972 | Shinoda et al. | 317/235 UA |

FOREIGN PATENTS OR APPLICATIONS

| | | | |
|---|---|---|---|
| 1,081,472 | 8/1967 | Great Britain | 317/235 G |

OTHER PUBLICATIONS

Marinace et al., "Selective Etching of Small Crystalline Structures," IBM Technical Discl. Bulletin, Vol. 12, No. 3, page 427 (Aug. 1969).

De Witt, "Field Effect Transistor," IBM Tech. Discl. Bull., Vol. 9, No. 1, June 1966 (page 102).

*Primary Examiner*—Rudolph V. Rolinec
*Assistant Examiner*—William D. Larkins
*Attorney, Agent, or Firm*—Kurt Kelman

[57] ABSTRACT

A compound semiconductor device is provided with at least one inwardly splayed groove by a method of etching which takes into account the crystal orientation of the semiconductor material.

15 Claims, 25 Drawing Figures

PATENTED MAY 28 1974 3,813,585

○ III Group (111) A-Plane : (111), (1̄1̄1), (1̄11̄), (11̄1̄)
◯ V Group (1̄1̄1̄) B-Plane : (1̄1̄1̄), (1̄11), (11̄1), (111̄)

INVENTORS
YASUO TARUI
YOSHIO KOMIYA
YASOO HARADA
BY
Kurt Kelman
AGENT

INVENTORS

YASUO TARUI
YOSHIO KOMIYA
YASOO HARADA

BY Kurt Kelman
AGENT

INVENTORS

YASUO TARUI

YOSHIO KOMIYA

YASOO HARADA

BY Kurt Kelman

AGENT

INVENTORS
YASUO TARUI
YOSHIO KOMIYA
YASOO HARADA
BY
Kurt Kelman
AGENT

INVENTORS

YASUO TARUI
YOSHIO KOMIYA
YASOO HARADA

BY Kurt Kelman

AGENT

INVENTORS
YASUO TARUI
YOSHIO KOMIYA
YASOO HARADA
BY
Kurt Kelman
AGENT

INVENTORS
YASUO TARUI
YOSHIO KOMIYA
YASOO HARADA
BY Kurt Kelman
AGENT

INVENTORS

YASUO TARUI
YOSHIO KOMIYA
YASOO HARADA

BY

Kurt Kelman
AGENT

INVENTORS
YASUO TARUI
YOSHIO KOMIYA
YASOO HARADA
BY
Kurt Kelman
AGENT

INVENTORS

YASUO TARUI
YOSHIO KOMIYA
YASOO HARADA

BY

Kurt Kelman

AGENT

INVENTORS
YASUO TARUI
YOSHIO KOMIYA
YASOO HARADA
BY Kurt Kelman
AGENT

INVENTORS

YASUO TARUI
YOSHIO KOMIYA
YASOO HARADA

BY

Kurt Kelman
AGENT

INVENTORS
YASUO TARUI
YOSHIO KOMIYA
YASOO HARADA
BY Kurt Kelman
AGENT

COMPOUND SEMICONDUCTOR DEVICE HAVING UNDERCUT ORIENTED GROOVE

The present invention relates to compound semiconductor devices each having at least one inwardly splayed groove thereon.

The term "inwardly splayed groove" used in this specification means a groove having a special shape in cross section wherein the respective side walls make an angle larger than 90° with respect to the main surface of the semiconductor substrate having that groove therein.

It is well known to etch a groove on a semiconductor substrate by use of an etching mask. The etched groove, in such case, however, is V-shaped or U-shaped in cross section and the side walls make an angle of 90° or less with respect to the main surface of the semiconductor. Hereinafter, grooves having such shape will be referred as "conventional grooves."

A primary object of the present invention is to provide field effect transistor (FET) having high frequency and high speed switching characteristics.

Another object of the present invention is to provide a high power Gunn effect device having excellent heat dissipation characteristics.

Other objects and advantages of the present invention will be understood from the following description of preferred embodiments of the present invention with reference to the drawings.

FIG. 1*a* is a perspective view showing the relation between (100) planes and (111) A-plane or $(\bar{1}\bar{1}\bar{1})$ B-plane;

FIG. 1*b* is cross-sectional view of a channel groove etched parallel to $\langle 0\bar{1}\bar{1} \rangle$ direction in (100) plane, FIG. 1*c* is a cross sectional view of a groove etched parallel to $\langle 01\bar{1} \rangle$ direction.

FIG. 2*a* is a perspective view when etched in $(\bar{1}\bar{1}\bar{1})$ B-plane showing that the insides of tetrahedron are composed of (111) A-planes of the semiconductor;

FIG. 2*b* is a cross sectional view showing a groove etched parallel to $\langle 1\bar{1}0 \rangle$ direction in $(\bar{1}\bar{1}\bar{1})$ B-plane;

Figure 9:
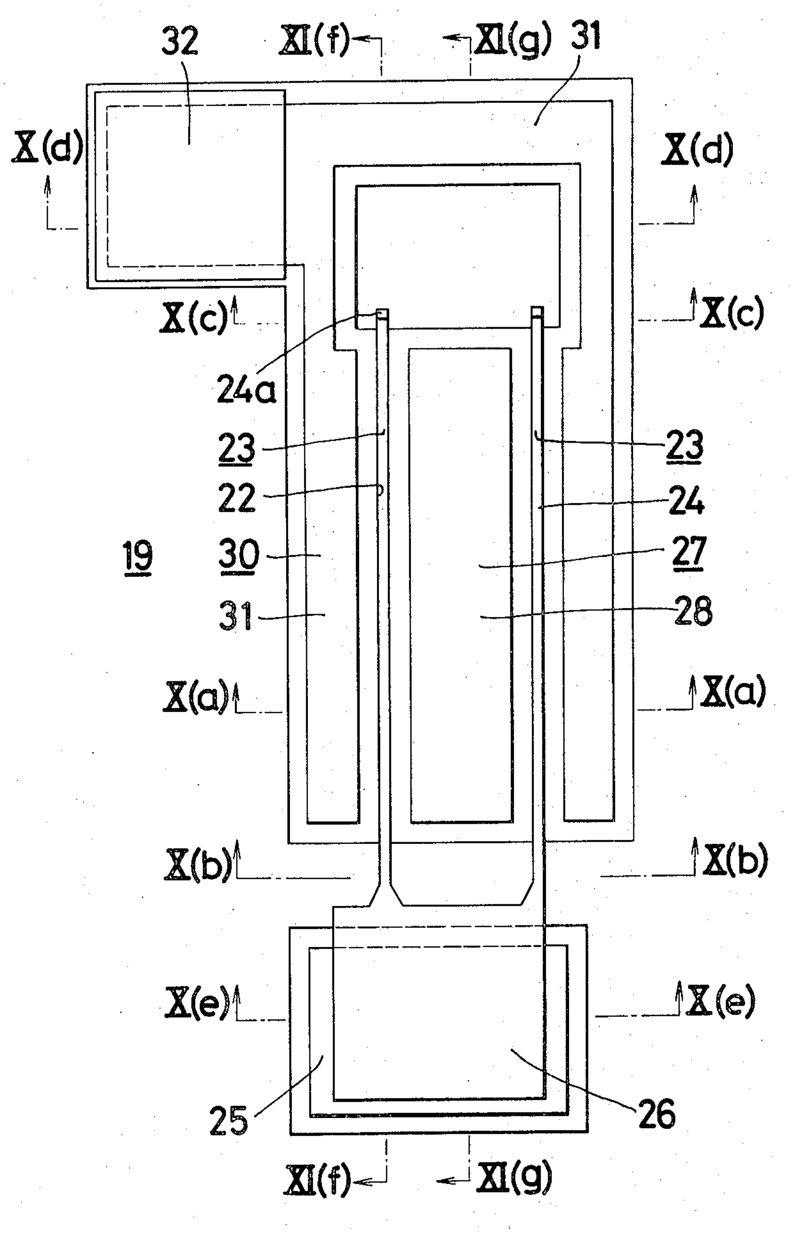
FIG. 9 is a plan view of high frequency FET fabricated in accordance with the present invention.
Figure 11F:
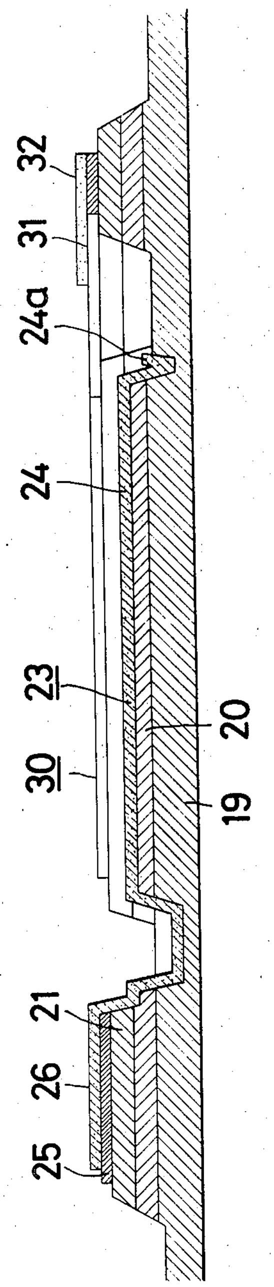
Figure 11G:
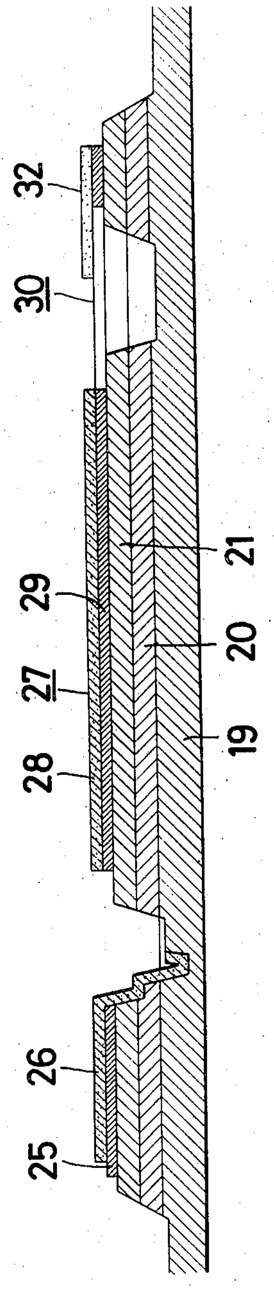
Figure 12:
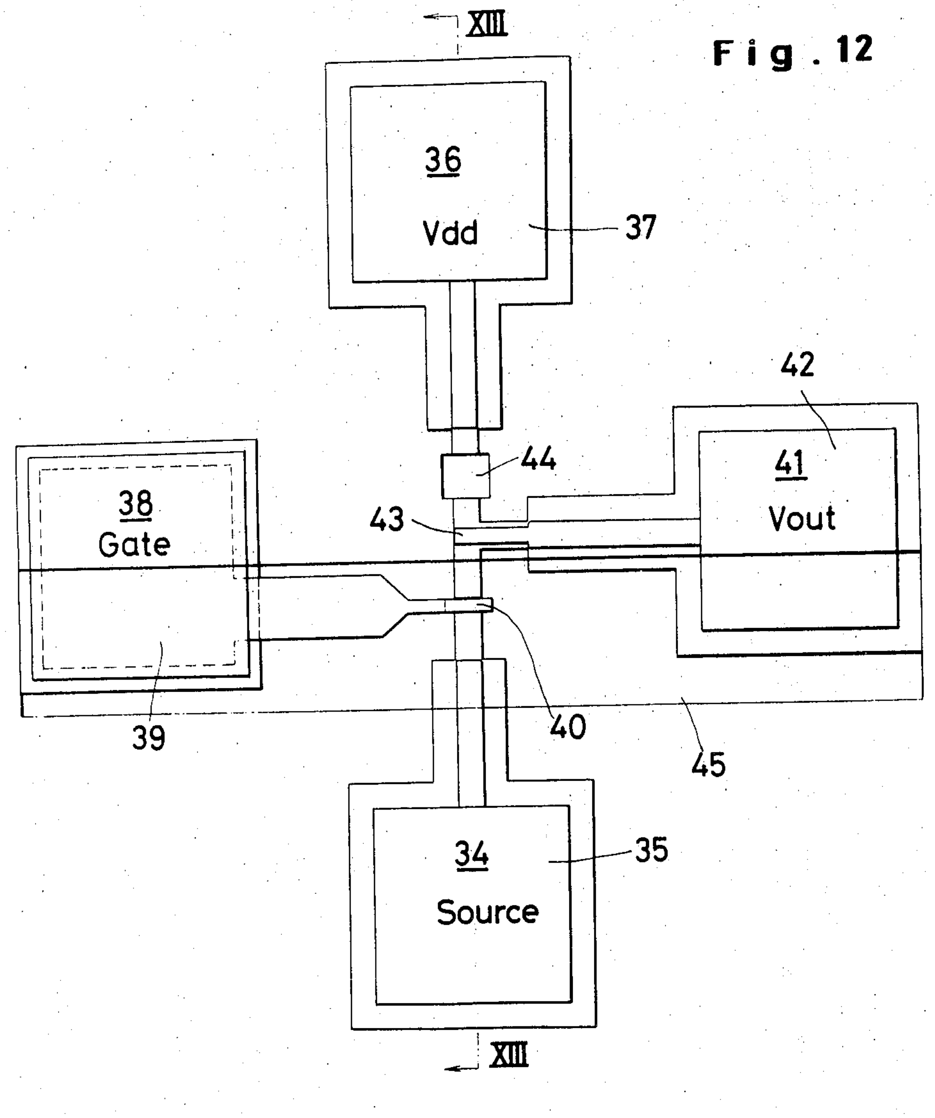
Figures 13, 15, 17:
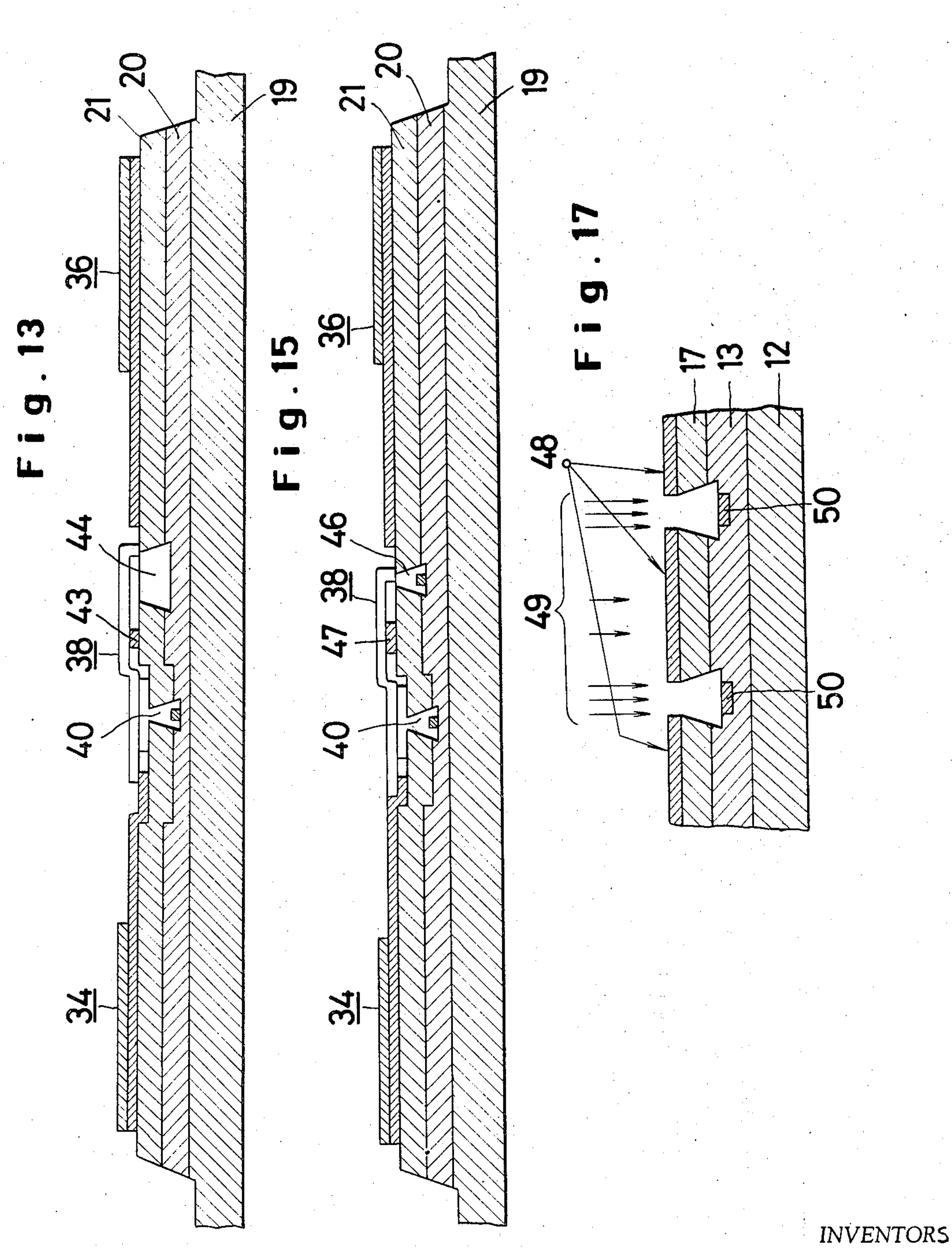
Figure 14:
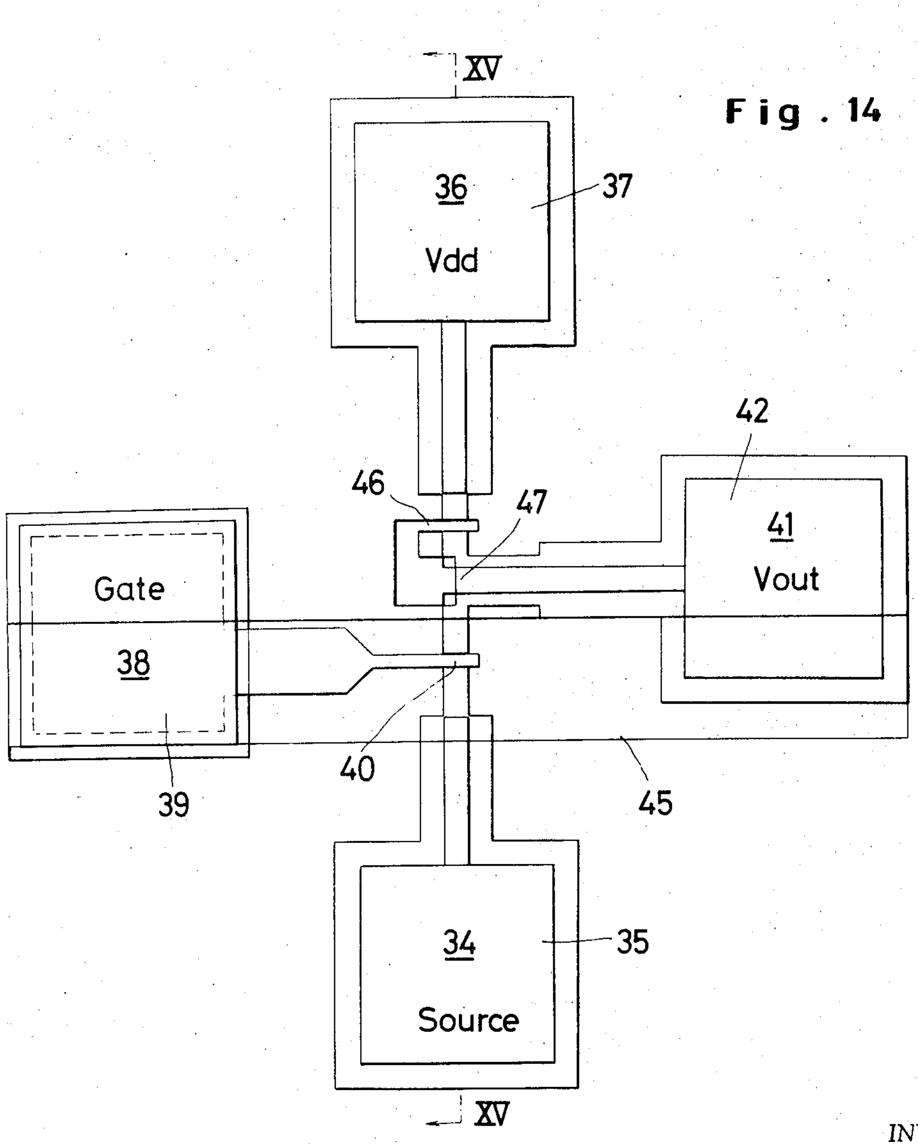
Figure 16:
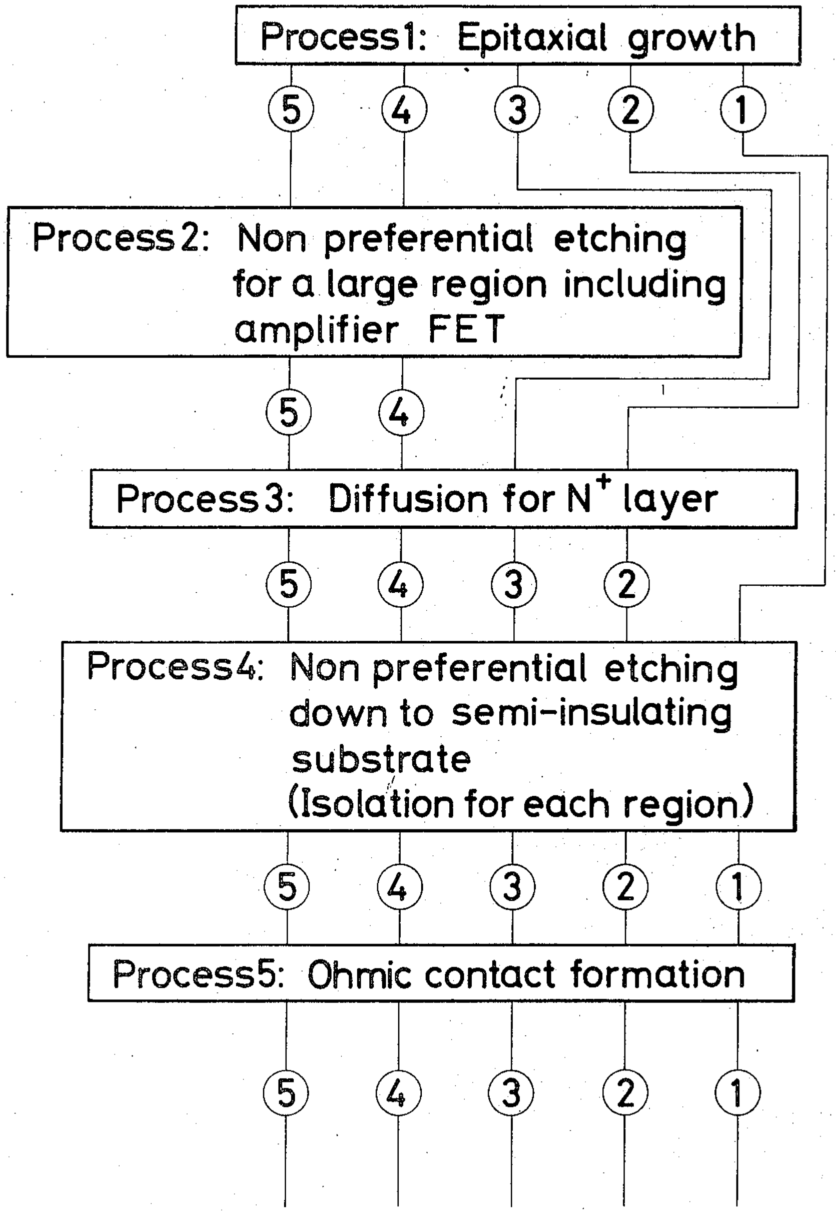
Figure 16B:
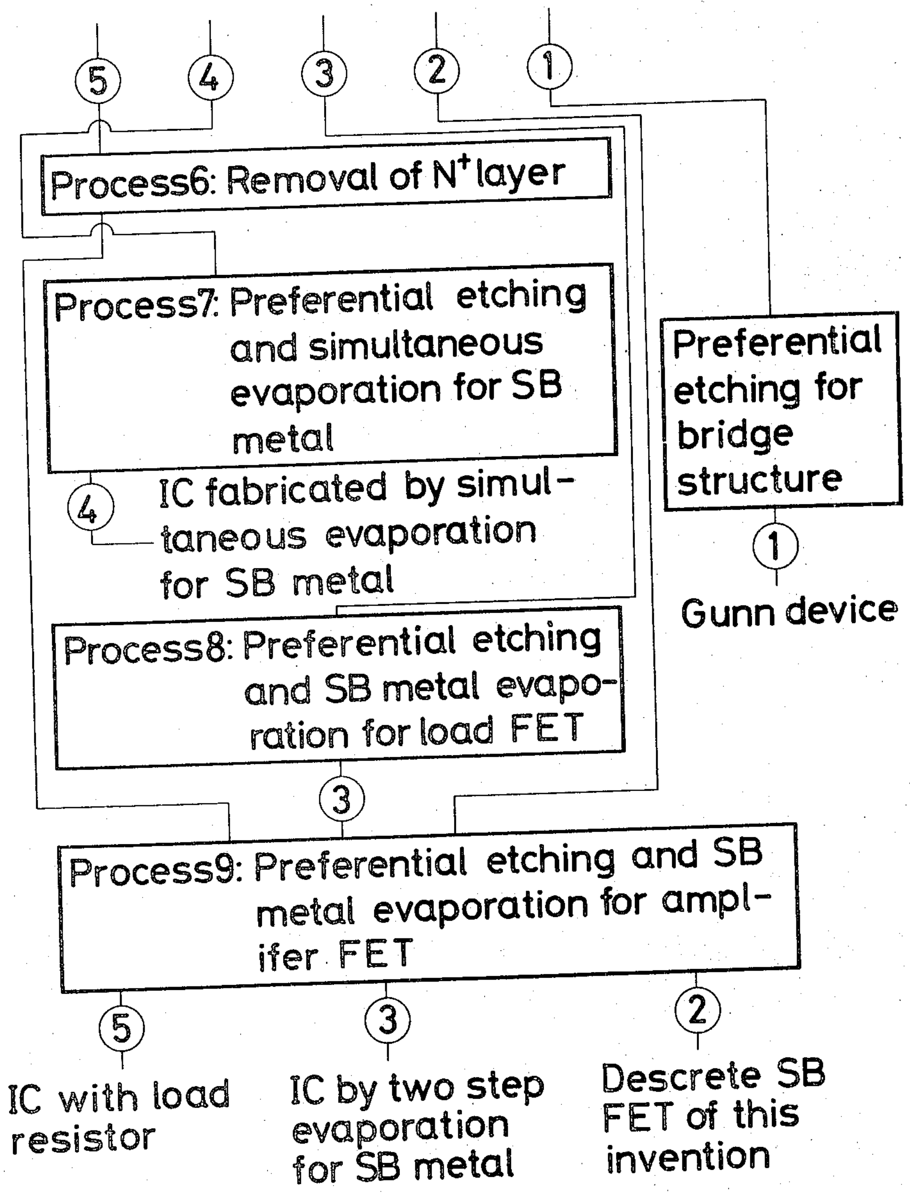

FIG. 10*a* – 10*e* are cross sectional views along lines X(*a*)—X(*a*), X(*b*)—X(*b*), X(*c*)—X(*c*), X(*d*)—X(*d*) and X(*e*)—X(*e*), respectively, of the FET shown in FIG. 9;

FIG. 11*f* and 11*g* are cross sectional views along lines XI(*f*)—XI(*f*) and XI(*g*)—XI(*g*), respectively, of the FET shown in FIG. 9;

FIG. 12 is a plan view of a basic construction of an inverter having a FET of this invention with a resistive load which is suitable to make it in integrated circuit form;

FIG. 13 is a cross sectional view along line XIII—XIII of the inverter shown in FIG. 12;

FIG. 14 is a plan view of an inverter constituted with two FETs each constructed in accordance with the present invention and one being used as its load;

FIG. 15 is a cross sectional view along line XV—XV, of the inverter shown in FIG. 14;

FIG. 16 illustrates processes for fabricating various compound semiconductor devices in accordance with the present invention; and FIG. 17 is a cross sectional view showing a junction type FET according to the present invention fabricated with processes of ion implantation and simultaneous self-alignment technics.

The present invention makes use of the fact that the etching rate differs considerably depending on which plane of the crystal forming the semiconductor is etched. That is, in FIG. 1 which shows an etching in the (100) plane of a compound semiconductor of Group III–V, there can be seen (111) and $(\bar{1}\bar{1}\bar{1})$ planes which have sides parallel and normal to the $\langle 011 \rangle$ direction, respectively.

When the semiconductor is channel-etched in the $\langle 0\bar{1}\bar{1} \rangle$ direction, the etching is terminated at the $(\bar{1}1\bar{1})$ and $(\bar{1}\bar{1}1)$ planes which are A-planes of the semiconductor and thus the angle $\theta$ between the side wall of the groove to be formed by the etching and the main surface of the semiconductor substrate in $(0\bar{1}\bar{1})$ cross section becomes $180° > \theta > 90°$ and the cross sectional shape of the groove becomes an inwardly splayed one as shown in FIG. 1*b*.

Figure 1C:
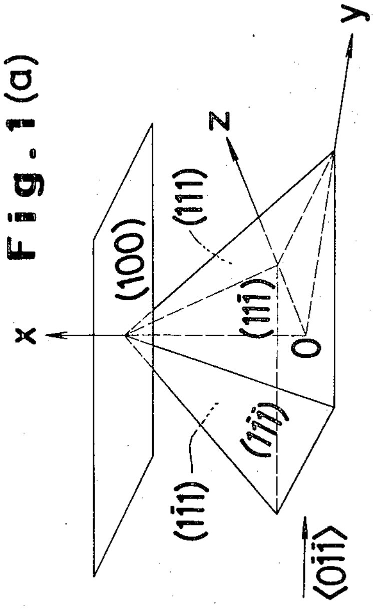
Figure 1C:
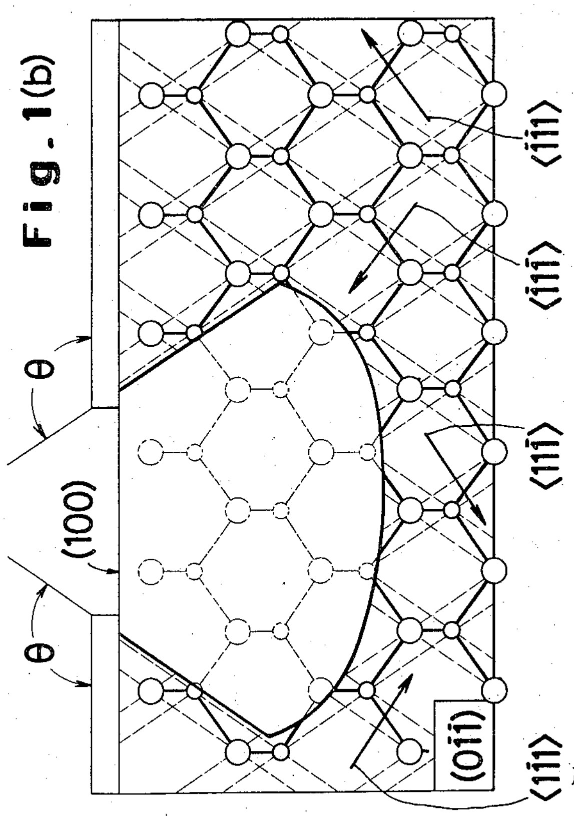
Figure 1C:
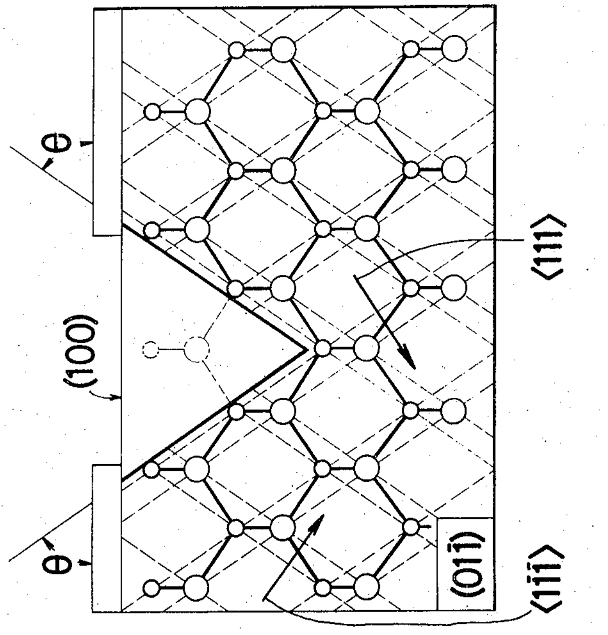

On the other hand, when the (100) plane is channel-etched in the $\langle 01\bar{1} \rangle$ direction and the resulting groove is observed in cross section of the $(01\bar{1})$ plane, it will be found that the etched groove is defined by A-planes constituted by (111) and $(1\bar{1}\bar{1})$ A-planes forming a V-shape as shown in FIG. 1*c*, due to the fact that the etching rate on the A-planes is the lowest.

The relation between the shapes of the grooves will be clearly understood by refering to the relation between the crossing four (111) A-planes or the $(\bar{1}\bar{1}\bar{1})$ B-plane and the (100) plane shown in FIG. 1*a*.

Figure 2A:
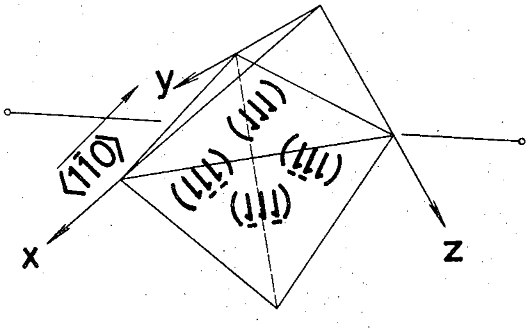

When the starting plane of the etching is $(\bar{1}\bar{1}\bar{1})$ B-planes, different grooves will result as shown in FIG. 2. FIG. 2*a* shows a groove having inside walls constituting a regular tetrahedron defined by only (111) A-planes. However, the outer walls of the tetrahedron are $(\bar{1}\bar{1}\bar{1})$ B-planes when viewed from outside.

Figure 2B:
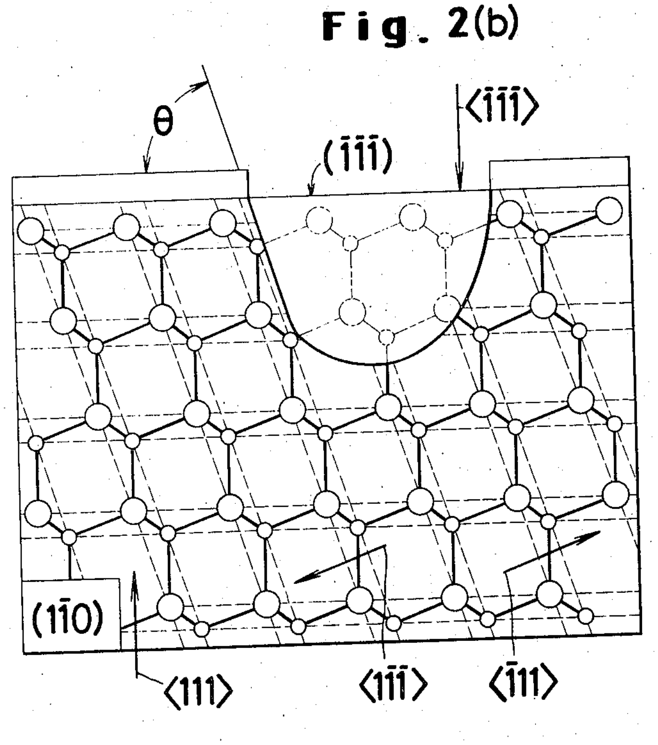

The cross section of the channel-etched groove taken in $\langle 1\bar{1}0 \rangle$ direction as shown by an arrow in FIG. 2*a* has a shape having a left side wall parallel to the crystal plane, since the etching of the left side is terminated on the $(1\bar{1}\bar{1})$ plane which is an A-plane as shown in FIG. 2*b*.

Figure 3:
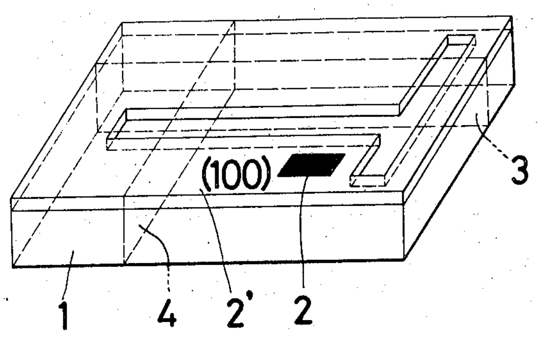
FIG. 3 is an explanating view showing a method for aligning a mask for the present preferential etching.

It is assumed that the (100) plane of the GaAs semiconductor is preferentialy etched to form a groove having the shape shown in FIG. 3.

Figure 4:
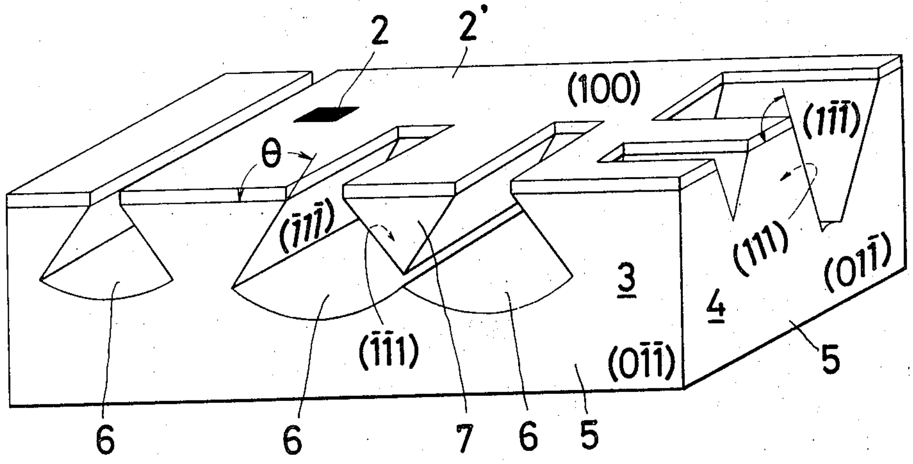
FIG. 4 is a perspective view showing a profile of etched grooves produced in (100) planes of GaAs semiconductor in accordance with the present invention.
Figure 5:
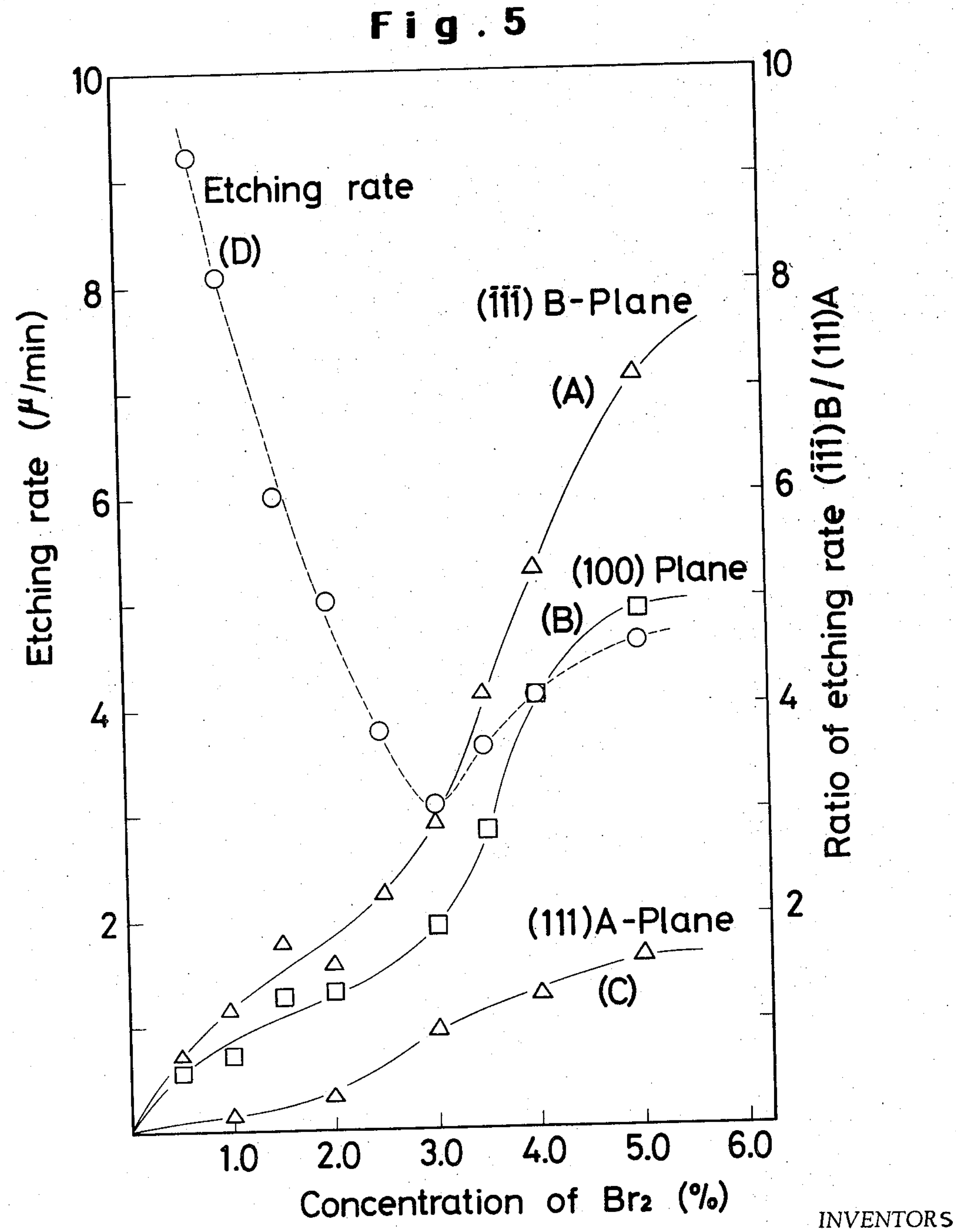
FIG. 5 is a graph showing a relation of the etching rate to the concentration of $Br_2$ in the etchant.

Firstly, in order to align a photo-etching mask on the (100) plane, a rectangular etching image 2 as shown in FIG. 3 is provided on a portion of a sample wafer of GaAs semiconductor 1 by, for example, using an aqueous solution of 33% $CrO_3$-HF. Since this pattern has its sides respectively parallel and normal to the $\langle 011 \rangle$ direction, preferential etching can be performed by aligning the mask with the groove direction using this image 2. The portion shown by numerals 3 and 4 in FIG. 3 show the planes to be observed in determining the shape of the groove to be etched. The shapes obtained by using a photo-engraved $Al_2O_3$ insulation mask 2' are shown in FIG. 4. By performing the channel-etching in this way, the resulting groove may be made to take the conventional shape or an inwardly splayed shape depending on the direction of channel-etching as shown in FIG. 4, according to the principle shown in FIG. 1*a*, 1*b* and 1*c*. Numeral 5 in FIG. 4 shows the face of a cross section taken for the sake of observation. When two inwardly splayed grooves 6 made parallel to each other at a short distance apart, the bottom portions thereof are connected with each other and a bridge structure 7 having triangular shape in cross section is provided as shown in FIG. 4. As shown in FIG. 4, such grooves may be produced by using any etchant which etches the (111) A-planes of the semiconductor at the lowest rate in comparison with those for other planes as previously noted. As an example, FIG. 5 shows that the etching rate of $Br_2$—$CH_3OH$ system is a function of the concentration of $Br_2$ in that system when GaAs is used as a semiconductor material. In FIG. 5, curves "A," "B" and "C" are etching rates for the ($\bar{1}\bar{1}\bar{1}$) B-plane, the (100) plane and the (111) A-plane respectively. When the concentration $Br_2$ is 1 percent at room temperature, the etching rate on B-planes is about 1.2 $\mu$/min while that on A-planes is about 0.13 $\mu$/min, the rate for B-planes being about 9.2 times that for A-planes. For $Br_2$ concentrations of 2 percent, the rate for B-planes is 1.5 $\mu$/min and that for A-planes is 0.3 $\mu$/min, the rate for B-planes being about five times that for A-planes. The ratio of the rate for B-planes to that for A-planes is shown by curve "D," the value being plotted on the right hand vertical axis. As clearly seen from FIG. 5, since the etching rates for B- and A-planes are different, the resulting groove may take either an inwardly splayed shape or the conventional shape according to the direction on crystal plane of the semiconductor selected for etching. While the above has been described when $Br_2$—$CH_3OH$ system is used as the etchant, it should be understood that the inwardly splayed groove such as shown in FIG. 1*b* may be formed using any etchant, provided that the selected etchant provides a considerable difference in etching rate in etching A-planes and other planes. While the above applies when GaAs of Group III–V is used as the compound semiconductor, substantially the same result may be obtaind for other semiconductors such as GaP or $GaAs_x P_{1-x}$, or ZnS or CdS etc.

Further, while the above applies in the case where the preferential channel-etching is started at the (100) plane, it is readily understood, on the basis of the principle that the etching is terminated on the A-plane, and that substantially the same result is obtained even when the starting plane of the etching is a plane other than (100), for example (211) or (311) plane. In such case, however, the cross sectional view of the etched groove may not become a symmetrical triangular.

Since, as shown in FIG. 4, the overhanging bridge 7 and reverse mesa structure 6 can be produced in GaAs crystals in a monolithic manner, a variety of novel semiconductor devices may be provided by using such structure.

Figure 6:
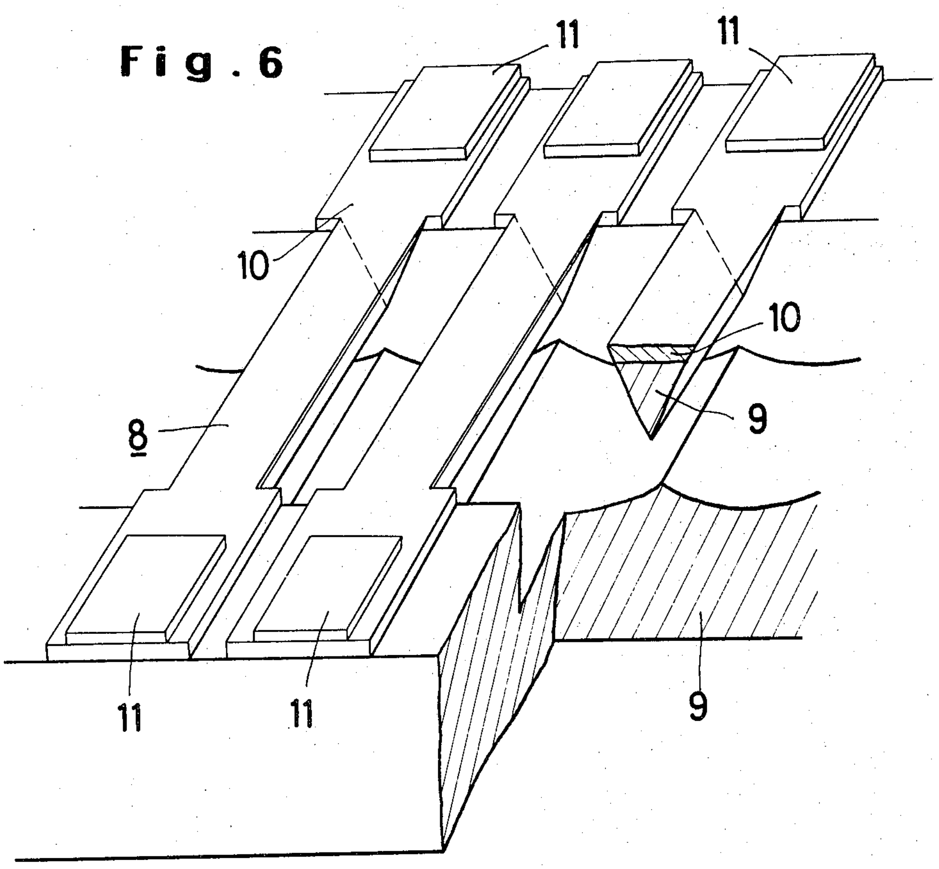
FIG. 6 is a perspective view of monolithic Gunn diodes with bridge structure fabricated in accordance with the present invention.

FIG. 6 shows an embodiment of a Gunn diode having such the bridge structure shown in FIG. 4 produced by channel-etching a semiconductor to form two closely spaced parallel reverse mesa grooves.

In FIG. 6, an operative portion of the Gunn diode is constituted of the triangular prism shaped bridge 8 comprising the semi-insulating substrate 9, and N layer 10. The ohmic metal layers 11 are formed on the both ends of the N layer by vacuum evaporation and adapted to be used as the ohmic contacts of the Gunn diode and serve as bonding pads for wiring.

When the dimensions of the upper surface of the bridge 8 of the Gunn diode are selected other dimensions of the bridge are automatically determined. A number of such very small bridges can be monolithically provided in a compound semiconductor such as GaAs. Further, in FIG. 6, when the N layer is provided as an epitaxial layer, Gunn devices having triangular prism shapes of various effective thickness may be obtained and freedom in the design of Gunn devices is thereby increased.

A very useful chart of the various modes possible in GaAs is given by Copeland in J. Appl. Phys. 38, 3096.

The ordinate and abscissa are the frequency $x$ length and doping $x$ length product respectively, and a locus of constant doping-frequency ratio is a straight line at 45° to the axes.

It is seen for $N_0l < \sim 10^{11}$ that domains are not normally formed, although if the device is near transit length, some space charge waves may be generated. The magnitude of the $N_0l$ product determines whether these waves grow into domains. At higher $N_0l$ products the sample would generate transit time Gunn domains.

For high $N_0l$ values ($\gg 10^{12}$) it is also seen that the two circuit controlled domain modes, i.e., delayed domains, which are most frequently exploited in practice give reasonable efficiencies and quenched domains. A quenched domain is a dipole domain which is able to travel only part way across a specimen before the average field swings below the sustaining level, and so the domain dies.

The L.S.A. conditions are fulfilled above the line $N_0l = 2 \times 10^5$ approximately and this mode, or a hybrid, is usually exploited for high frequency high power operation.

Below $N_0l \approx 10^{11}$ then, domains are not normally formed. There is a still bulk negative resistance however, and this can be used to make an amplifier.

On the other hand, S. Kataoka et al., (Electron Lett. 5, 48 1969) have experimentally investigated the influence of dielectric surface loading on GaAs and found that the current oscillation due to the travel of a high-field domain in bulk GaAs can be suppressed if the surfaces of the GaAs are covered with a sheet of $BaTiO_3$, even for the $N_0l$ product much larger than $10^{12}cm^{-2}$.

Furthermore, according to P.N. Robson (IEEE ED-14, 612–5, 1967), the high field domains may also be stabilized, or inhibited from forming, if the thickness of the active material in a direction perpendicular to the electric field is small enough. If this dimension is d then the critical value is given approximately by:

$$N_0d = 10^{11}cm^2.$$

The electric field outside the device, produced by a domain or incipient domain inside, acts in such a sense as to restore the charge distribution to a uniform state, opposing the formation of the domain. With sufficiently thin geometry, the effect is important. It can be enhanced by placing high permittivity material against the active device so that the depolarizing field has greater effect.

The technique can be used to stabilize comparatively high current devices for use as amplifiers, which would form domains and oscillate if the $N^0l$ factor were the only controlling influence.

Since the freedom on structural selection of the semiconductor devices is considerably large when the present invention is utilized, this invention is advantageous in designing devices such as Gunn diode elements whose operational characteristics vary depending upon their $n \cdot L$ product or $n \cdot T$ product where "$n$" is carrier density, "L" is length of device and "$T$" is effective thickness of device.

Further, since the bridge is surrounded by air, the thermal heat dissipation characteristics of such devices can be improved by re-filling the space surrounding the bridge with a material of a high heat conduction efficiency different from that of the semiconductor material. When the space is re-filled with a material having a different dielectric constant from that of the semiconductor, the suppression of oscillation of the Gunn device may become possible. Further, since recent photoetching technics permit formation of relatively small size structures having the desired shape, the control of oscillation and/or oscillation mode of the Gunn effect devices is made possible by using the limitation of its $n \cdot T$. product.

An example of an FET produced by using the present etching method will be described with reference to FIGS. 7 to 15.

Figure 7:
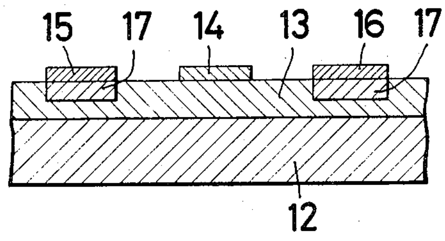
Fig. 7 (PRIOR ART)
FIG. 7 is a cross sectional view of a conventional FET.

The convention FET comprises a semi-insulating substrate 12, an epitaxial N layer 13 grown on the substrate, and a gate 14 provided on the N layer 13 by Schottky barrier diode (SBD) junction, as shown in FIG. 7.

However, the distances from the gate 14, to the source 15 and the drain 16 must be on the order of 2 microns or greater due to the limitations of the photoetching technic, etc. Further, SBD gate 14 is provided by a different process than the source 15 and the drain 16. The structure of the gate 14 is a Schottky barrier type or junction type while those of the source 15 and drain 16 are $N^+$ diffusion 17 or $N^+$ ohmic contacts. Therefore, at least two photoetching steps are required. For these reasons, the self-alignment of the gate 14, as against source 15 and drain 16 cannot ordinally be performed.

Further, since such an FET has a plannar arrangement of the components, the feedback capacitance $C_{gd}$ between the gate and the drain, which is one of factors affecting the high frequency characteristics of an FET, cannot be made negligible because when it is desired to reduce the size of the element and permit it to be applied to high frequency application, the feedback capacitance $C_{gd}$ cannot be decreased due to the large dielectric constant of the semiconductor positioned between the gate and the drain, where the dielectric constant of the GaAs is $12\epsilon o$. Whereas it is necessary to reduce the size of the FET for high frequency application, a short distance between the gate and the drain causes a high $C_{gd}$.

Further, as mentioned previously, the distances from the gate to source and drain cannot be made less than 2 microns by present photoetching technology. A series resistance $R_d$ between the gate and the drain and a series resistance $R_s$ between the source and the gate therefore, may be a considerably important factor at high frequency operation and thus the effective output conductance $g$(obs) of the FET will be decreased according to the following equation $$g(\text{obs}) = g/[1 + (Rs + Rd)g]$$

where $g$ is the intrinsic output conductance of the FET, and the effective mutual conductance $Gm$(obs) of the FET will also be decreased in accordance with the following equation.

$$Gm(\text{obs}) = Gm/(1 + \text{RsGm})$$

Figure 8:
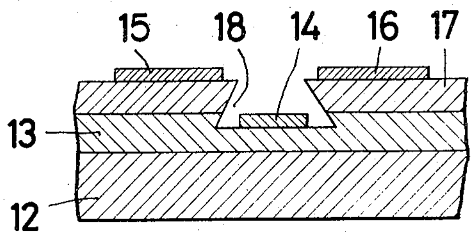
FIG. 8 is a cross sectional view of the FET according to the present invention.

The high frequency self-aligned FET constructed with the inwardly splayed groove structure according to the present invention eliminates the above mentioned disadvantages. The structure of the self-algined gate FET is shown in FIG. 8 and the FET is produced by a method comprising the steps of forming epitaxial N layer 13 on a semi-insulating substrate 12, forming $N^+$ layer 17 on the epitaxial N layer 13 by diffusion or epitaxial growth, attaching ohmic contacts for source 15 and drain 16 on the $N^+$ layer 17. In this case, the geometrical shape of the ohmic contacts are made by separate photoetching of a rough alignment.

After attachment of the ohmic contacts, selective preferential etching is performed to form inwardly splayed groove 18 down to the N layer by using a suitable mask for the gate portion. The final step is performed by providing Schottky gate metal by evaporation from the direction perpendicular to the main GaAs surface by a self-algined method utilizing the geometrical structure of the inwardly splayed groove 18.

Use of the self-aligned method for the gate means that the Schottky gate metal produced by evaporation is physically separated and electrically isolated by the stretched out edges of the inwardly splayed groove. In this case the mask pattern for the gate can be used as the same geometrical mask made by an insulator layer and a photo resist layer for the etching of inwardly splayed groove and undesired portions of Schottky metal except the gate portion is removed in taking away the photo resist by a photo resist stripper.

The FET constructed as above has the following advantages.

1. The length of the gate can easily be made shorter by this self-aligned method.

2. The distances between the gate and the source and also between the gate and the drain can be reduced to less than the minimum limit of about 2 microns by present photoetching technology, so that the series resistance therebetween can be minimized. Electrical short circuits which may be expected for such very short distances between the electrodes can be avoided by the presence of the air-insulated spaces produced by the inwardly splayed groove structure.

3. Although the feedback capacitance $C_{gd}$ between the drain and the gate generally becomes greater with reduction of the distance therebetween, in the present invention, the portion between these electrodes is insulated by air as mentioned above and therefore the capacitance $C_{gd}$ is decreased.

As above described, according to the present invention, an FET having very high frequency and high speed characteristics not obtainable by conventioned methods can be provided on a semi-insulated substrate such as GaAs while maintaining a relatively small distributed capacitance.

A process for manufacturing an FET of the present invention will be described with reference to FIGS. 9 to 11, in which a combination of the preferential etching and the conventional non-preferential etching technics is utilized.

FIGS. 9 to 11 show an FET comprising a semi-insulating substrate 19, an epitaxial N layer 20 provided thereon and an $N^+$ layer 21 also provided on the N layer 20. The present preferential etching method which takes advantage of the orientation of the crystal planes of the substrate is used to make two inwardly splayed grooves 22 extending in parallel and spaced apart from each other by a drain region 27. Schottky barrier metals 24 for gates 23 are vacuum evaporated on the bottom of the grooves 22 in self-aligned manner. One end of the Schottky gate metal 24 which extends along the bottom of each groove 22 is connected to an ohmic metal 25 which forms a bonding pad portion for the gates 23. Ohmic metal 25 is evaporated on the $N^+$ layer 21 as shown in FIG. 11.

In the case of GaAs, tin, platinum, Au-In-Ge or Sn-Ag alloy etc., can be utilized as the ohmic metal. However, the ohmic metal may be the same material as the Schottky barrier metal, if desired. Schottky barrier metal on the ohmic metal 25 of the gate bonding pad 26 is provided for wiring convenience in the fabrication process. An ohmic contact metal 29 is provided on the drain 27 and a Schottky barrier metal 28 is provided on the ohmic metal 29 for wiring.

Ohmic metal 31 is provided on the $N^+$ layer 21 and the source 30 and is connected to the source bonding pad 32 as shown in FIG. 9.

The fabricating process for this discrete SBD gate FET is described hereinafter with reference to FIG. 16. In FIG. 16 are shown the various processes of fabrication for several devices of this invention. The process order 2 in FIG. 16 corresponds to the discrete SBD FET as shown in FIGS. 9 – 11.

A discrete SB FET shown in FIG. 9 is obtained by the steps of providing an epitaxial N layer 20 on a semi-insulating substrate 19 (Process 1), depositing an insulating film on the $N^+$ layer 21 which is formed by diffusing impurities (Process 3), photoetching an insulating layer mask of the isolation pattern and non preferentially etching the stacked body down to the semi-insulating substrate 19 to remove unusable N and $N^+$ layers for isolation of a source 30, drain 27 and gate 23 regions of an FET (Process 4).

Non preferential etching which is not dependent on the crystalline orientation is conducted to form a conventional U-shape groove for the isolation of the gate, the source and the drain portions. The non preferential etching for the isolation is followed by the step for photo-engraving an insulating layer on the $N^+$ layer of the isolated regions, the step for photoetching the isolated region in a desired pattern to form ohmic contact portions 29 and 31 for the drain portion and the source portions (Process 5), the step for preferentially etching a pair of inwardly splayed channeled grooves 22, the step for forming gate portions 23 by depositing Schottky barrier metal 24 into the grooves in the self-aligned manner (Process 9).

Schottky barrier metal in this case is used also as electrode material for the source, the drain and the gate for convenience in the fabrication process. In this case, the undesired portion of the Schottky barrier metal on the photo-resists is removed by taking away the photo-resist mask with a photo-resist stripper.

The photoetching process for fabricating a discrete FET having the above described structure comprises the following three steps;

1. Uniform selective etching down to the substrate,
2. Photoetching of ohmic metal,
3. Preferential etching dependent on the orientation of the crystal planes of the semiconductor.

According to such structure, the feedback capacitance and distributed capacitance can be minimized because of the air insulation effect of the inwardly splayed grooves 22 even when the channel lengths of the gate are shortened and the distances from the gates 23 to source 30 and drain 27 are decreased.

Figure 10A:
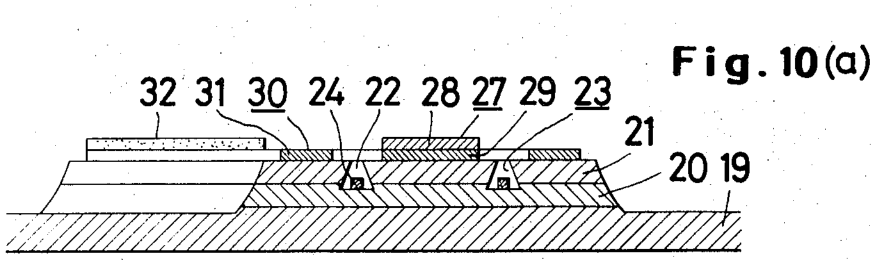
Figure 10B:
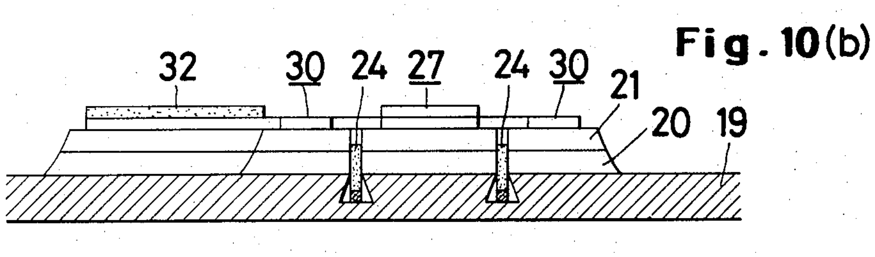
Figure 10C:
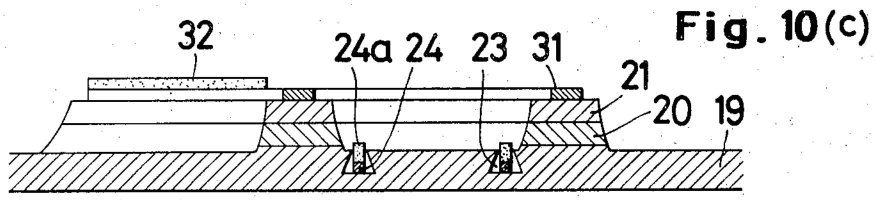
Figure 10D:
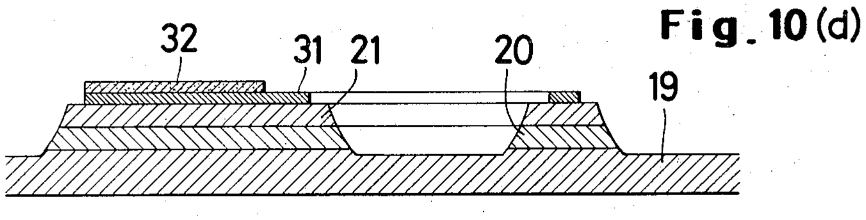
Figure 10E:
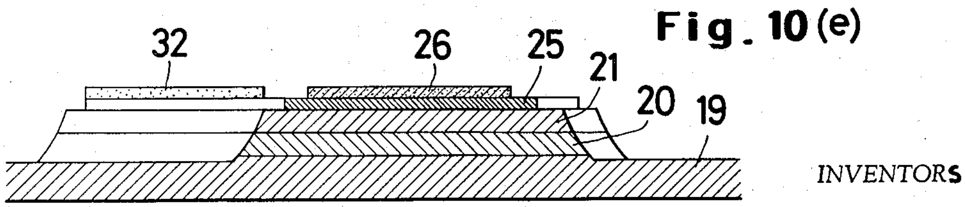

FIG. 10a is a cross-sectional view along line X(*a*)—X(*a*) in FIG. 9 and shows the active part of the FET, and FIG. 10b which is a cross-sectional view along line X(*b*)—X(*b*) in FIG. 9 shows the portion adapted to lead out a wire from the electrodes of Schottky barrier metal 24 provided within the inwardly splayed grooves 22 as gate 23. FIG. 10c is a cross-sectional view along line X(c)—X(c) in FIG. 9. This portion 24a of the gate metal is provided to prevent the source 30 and drain 27 from being in constant conductive contact because of the absence of the Schottky barrier metal in this portion. FIG. 10d is a cross-sectional view along line X(*d*)—X(*d*) in FIG. 9 and shows the portion including the ohmic contact 31 of the source 30 and the source bonding pad 32. FIG. 10e which is a cross-sectional view along line X(*e*)—X(*e*) in FIG. 9 shows the bonding pad 26 of the gate 23.

FIG. 11f is a cross-sectional view of inwardly splayed groove portion 22 of the Schottky barrier gate 23 along line X(*f*)—X(*f*) in FIG. 9 and shows how the active portion of the Schottky barrier gates 23 and the gate bonding pad 26 are connected.

FIG. 11g is a cross-sectional view along line X(*g*)—X(*g*) in FIG. 9 wherein the Schottky barrier metal 28 formed on the ohmic metal 29 on the drain portion is adopted even as the electrode material of interconnection for convenience in the fabricating process. In this case, Schottky barrier metal evaporation can be used as a final process.

The FET having structure as heretofore described, has advantages such as follows;

1. Schottky gate metals are isolated from source and drain regions in a self-aligned way by utilizing the inwardly splayed groove. Therefore the channel length may be made shorter than in the conventional FET.

2. Both source and drain regions are relatively closely spaced from the gate regions and therefore, the series resistances therebetween may be minimized. In spite of the short distance from gate to source, and drain no electrical-short circuit occur therebetween due to the air isolation effect.

3. Although the feedback capacitance $C_{gd}$ between the drain and the gate might be expected to be made greater because of the short distances from gate to the source and drain regions, the capacitance can actually be reduced in the present invention due to the air isolation effect of the inwardly splayed groove.

4. Electrode for interconnection of Schottky barrier gate can be led out from the conventional U-shaped slope at the end of the inwardly splayed channel groove.

As a result, the etching behaviors as shown in FIG. 3 can be utilized in both the X and Y directions.

5. Due to the above advantages, an FET having a very high frequency and high speed characteristics but with small distributed capacitance can be obtained on a semi-insulating substrate.

Example methods for fabricating an integrated circuit (IC) using the above described FET will be described below. As the basic constructive element of the IC, in this case, an inverter using the FET is employed. As such inverter, resistive load type structures are shown in FIGS. 12 and 13 and a SBD FET load type structure constituted with two series connected FETs is shown in FIG. 14 and 15.

In FIG. 12, a source 34 is provided at a position opposited to a Vdd 36. Numerals 35, 37, 39, 42 indicate the bonding pad of source 34, Vdd 36, Gate 38, and Vout 51 respectively. The portion 43 is connecting point between the drain terminal and Vout bonding pad 42. An SB FET 40 for amplification is formed in accordance with the self-aligned method by disposing a Schottky barrier metal onto the bottom of the inwardly splayed groove 33 which is formed in accordance with the present invention and extends down to the N layer 20.

The portion 44 is used as load register which is made by photoetching and selective etching of $N^+$ layer at the same portion 44. The domain 45 is the portion etched in the large area in the first step of the fabrication process for the purpose of controlling the threshold voltage of SB FET 40 for amplification, which is performed by changing the thickness of the N layer 20.

FIG. 13 is a cross sectional view of invention with registive load 44 along line XIII—XIII of FIG. 12. In this Figure, the thickness of N layer 20 at SB FET 40 differs from that of the portion for the registive load 44. This difference of N layer thickness between the FET portion 40 and registive load portion 44 is realized by the previously etched portion of large area 45 which contains FET portion 40 but does not contain load portion 44. By this method the SB FET for amplification in FIGS. 12 and 13 can be made of normally off condition. On the other hand, as shown in FIGS. 14 and 15, it is possible to form an inverter construction having as its load an FET 46 similar to the FET 40 for amplification. In this case, the FET 46 has a gate and a source interconnected with each other and can be used as a load resister whose value varies with the current through the FET 46.

The difference of thickness between the N layer 20 of FET 40 for amplification and N layer 20 of FET 46 for load can be controlled by changing the N layer thickness of FET 40 which is realized by utilizing previously etched domain 45 at large area containing only FET 40 for amplification region.

By this method FET 46 for load can be operated in depletion mode and FET 40 for amplification is operated in enhancement mode.

This kind of inverter in the form of the enhancement-depletion mode has the advantages that the noise margin is larger than that of an inverter with the resistive load due to the characteristics of the load curve of the depletion FET having its gate connected to its source and a higher pulse response can be obtained.

In the case when a difference of N layer thickness between FET 40 for amplification and FET 46 for load is controlled by suitable amount of thickness, SB metal gate portions for FET 40 and for FET 46 can be made by simultaneous preferential etching for inwardly splayed groove and the simultaneous deposition of Schottky gate metal in self-aligned way. Of course such an inverter with enchancement depletion mode can be made by fabricating each SB FET by means of separate preferential etching and unsimultaneous evaporation of two kinds of different SB metal.

Numeral 47 indicates a connecting portion for the Vout bonding pad 42 and intermediate position between FET 40 and FET 46.

In FIG. 16, various process which are used for fabrication of the ICs, discrete SB FETs and, Gunn devices of this invention are systematically shown.

In FIG. 16, there are nine main processes, and various combinations of these processes are utilized for the fabrication of each device.

Details of each process are explained as follows:

| | |
|---|---|
| Process 1: | Epitaxial Growth |
| Process 2: | Non preferential etching for a large region including amplifier FET |
| (I) | deposition of an insulator layer |
| (II) | photo-engraving for insulator layer |
| (III) | selective non preferential etching which does not depend on orientation of crystalline plane |
| (IV) | removal of the insulator layer |
| Process 3: | Diffusion for $N^+$ layer |
| Process 4: | Non preferential etching down to semi-insulating substrate (isolation for each regions) |
| (I) | deposition of an insulator layer |
| (II) | photo-engraving for the insulator layer and removal of the photoresist |
| (III) | non preferential etching down to semi-insulating substrate |
| (IV) | removal of the insulator layer and deposition of a new insulator layer |
| Process 5: | Ohmic contact formation |
| (I) | photo-engraving for photoresist layer and insulator layer |
| (II) | ohmic metal evaporation |
| (III) | removal of ohmic metal on photoresist layer and the photoresist by a photoresist stripper |
| Process 6: | Removal of $N^+$ layer |
| (I) | photo-engraving for an insulator layer |
| (II) | selective removal of $N^+$ layer |
| (III) | removal of the photoresist |
| Process 7: | Preferential etching and simultaneous evaporation for SB metal |
| (I) | photo-engraving for a photoresist layer and the insulator layer |
| (II) | selective preferential etching which depends on orientation of crystalline plane |
| (III) | evaporation of SB metal |
| (IV) | removal of SB metal on the photoresist and the photoresist by a photoresist stripper |
| Process 8: | Preferential etching and SB metal evaporation for the load FET |
| (I) | photo-engraving for a photoresist layer and the insulator |
| (II) | selective preferential etching which depends on crystalline plane |
| (III) | evaporation of SB metal |
| (IV) | removal of SB metal on the photoresist and the photoresist by a photoresist stripper |
| Process 9: | Preferential etching and SB metal evaporation for the amplifier FET |
| (I) | photo-engraving for a photoresist layer and the insulator |
| (II) | selective preferential etching which depends on orientation of crystalline plane |
| (III) | evaporation of SB metal |
| (IV) | removal of SB metal on the photoresist and the photoresist by a photoresist stripper |

In these processes as described above, the insulator layer are made from $Al_2O_3$ layer or $SiO_2$ layer which is deposited by electron beam evaporation.

There is five devices in FIG. 16 for which the combination of these processes are indicated as Process Orders (1) (2) (3) (4) and (5). Each Process Order in FIG. 16 is indicated as follows:

Process Order (1) Gunn device with bridge structure

Process Order (2) · Discrete self-aligned SB FET with inwardly splayed grooves

Process Order (3) IC by two step evaporation for the SB metal (an inverter with enhancement and depletion FET)

Process Order (4) IC fabricated by the simultaneous evaporation of SB metal (an inverter with enhancement FET and depletion FET)

Process Order (5) IC with load resistors (an inverter with a load resistor)

In accordance with the present invention, various compound semiconductor devices can be obtained by using combinations of various process in desired sequence, such as in the above described manners.

Further, according to the present invention, the junction type FET shown in FIG. 17 can also be constructed by ion implantation in the self-aligned way. In FIG. 17 numeral 48 denotes a metalic evaporated film mask for preventing the implantation of the ions, 49 an incident direction of dopant in ion implantation and 50 a PN junction formed by the implantation of the ions, respectively. Therefore the present invention can be applied not only to an SB gate FET but also to a junction gate FET by utilizing the tecnics of ion implantation.

What is claimed is:

1. A semiconductor device comprising:

a. a III-V compound semiconductor substrate having a Zinc-blend crystalline structure, the main surface of which is substantially in a (100) plane, said crystalline structure being monocrystalline;

b. at least one groove disposed in the crystalline structure, said groove being inwardly splayed with increasing width with depth from the surface, said groove being in the main surface and in the $\langle 01\bar{1} \rangle$ direction;

c. right side and left side walls of said groove being substantially constituted by (111) A planes;

d. an etched channel of said substrate in $\langle 01\bar{1} \rangle$ direction being different from the inwardly splayed groove structure;

e. a semi-insulating substrate;

f. an N layer on said semi-insulating substrate and an $N^+$ layer on said N layer, said grooves extending into said N layer to a distance less than the full thickness thereof;

g. a source region and a drain region of said device separated by one of said grooves;

h. a metal forming a Schottky barrier with the N layer, said metal disposed on the bottom surface of said groove, the width and the position of said metal being substantially the same as those of the upper opening of said groove and spaced from the sides of said groove when on the bottom surface;

i. said source region, said drain region and a gate bonding pad being separated from other portions of the N layer and the $N^+$ layer by selectively etched grooves;

j. said metal forming a strip-like gate electrode disposed on the bottom of said groove and extending in the $\langle 01\bar{1} \rangle$ direction and led to the gate bonding pad over a slope in a (111) A plane having a gentle gradient; and k. the gate region, the source region and the drain region defining a FET having a short channel length to thereby reduce the source resistance and the drain resistance of the FET for high frequency.

2. An integrated circuit comprising at least two FET structures defined in claim 1 wherein said FET structures are interconnected, the thickness of the semiconductor N layer beneath the respective gates being different whereby the threshold voltages thereof are different from each other.

3. The integrated circuit of claim 2 wherein said FET structures are interconnected in series.

4. The integrated circuit of claim 2 wherein said FET structures are interconnected in parallel.

5. An integrated circuit comprising a multiple number of FET structures defined in claim 1 wherein said FET structures are interconnected, the threshold voltages of said FET structures having different values, the different values resulting by using at least two metals forming a Schottky barrier.

6. The integrated circuit of claim 5 wherein said FET structures are interconnected in series.

7. The integrated circuit of claim 5 wherein said FET structures are interconnected in parallel.

8. A semiconductor device comprising:

a. a III-V compound semiconductor substrate having a Zinc-blend crystalline structure, the main surface of which is substantially in a (100) plane, said crystalline structure being monocrystalline;

b. at least one groove disposed in the crystalline structure, said groove being inwardly splayed with increasing width with depth from the surface, said groove being in the main surface and in the $\langle 01\bar{1} \rangle$ direction;

c. right side and left side walls of said groove being substantially constituted by (111) A planes;

d. an etched channel of said substrate in $\langle 01\bar{1} \rangle$ direction being different from the inwardly splayed groove structure;

e. a semi-insulating substrate;

f. an N layer on said semi-insulating substrate and an $N^+$ layer on said N layer, said grooves extending into said N layer to a distance less than the full thickness thereof;

g. a source region and a drain region of said device separated by one of said grooves;

h. a PN junction gate on the bottom surface of said groove, the width and the position of said PN junction gate being substantially the same as that of the upper opening of said groove and spaced from the sides of said groove when on the bottom surface;

i. said source region, said drain region and a gate bonding pad being separated from other portions of the N layer and $N^+$ layer by selectively etched grooves;

j. said PN junction gate forming a strip-like gate electrode disposed on the bottom of said groove and extending in the $\langle 01\bar{1} \rangle$ direction of the gate bonding pad, said gate bonding pad connected in the $\langle 01\bar{1} \rangle$ direction to the P region of said PN junction; and k. the gate, region, the source region and the drain region defining a FET having a short channel length to thereby reduce the source resistance and the drain resistance of the FET for high frequency.

9. An integrated circuit comprising at least two FET structures defined in claim 8, wherein said FET structures are interconnected, the threshold voltages thereof being different from each other, said difference resulting by varying the thicknesses of the semiconductor N layer beneath the respective gates.

10. The integrated circuit of claim 9 wherein the FET structures are interconnected in series.

11. The integrated circuit of claim 9 wherein the FET structures are interconnected in parallel.

12. A semiconductor device comprising:

a. a III–V compound semiconductor substrate having a Zinc-blend crystalline structure, the main surface of which is substantially in a (100) plane, said crystalline structure being monocrystalline;

b. at least one groove disposed in the crystalline structure, said groove being inwardly splayed with increasing width with depth from the surface, said groove being in the main surface and in the <0$\bar{1}\bar{1}$> direction;

c. right side and left side walls of said groove being substantially constituted by (111) A planes;

d. a plurality of said inwardly splayed grooves being disposed in the main surface and each having a longitudinal axis parallel to each other in the <0$\bar{1}\bar{1}$> direction with an interconnected space coupling the bottom portion of said plurality of adjacent inwardly splayed grooves, the cross section of crystalline portion left between said grooves being in the shape of a triangle and the inward walls of said portion below the main surface plane being in substantially (111) A planes.

13. The semiconductor device set forth in claim 12 wherein said substrate has an N-type layer on a semi-insulating substrate; at least one bridge structure made of said portion being formed in the <0$\bar{1}\bar{1}$> direction; a plurality of pairs of ohmic metal electrodes provided along the <0$\bar{1}\bar{1}$> direction with a space therebetween at both ends of said bridge and disposed to permit flow of current in said N layer, the N layer between said ohmic metal electrodes thereby defining a Gunn diode, each Gunn diode being isolated from an adjacent Gunn diode; and the depth, width and length of said N layer in the upper part of said portion selected to control the mode of oscillation of said Gunn diode whereby a monolithic Gunn array is formed.

14. The monolithic Gunn device array set forth in claim 13, further comprising a filler of material of high heat-conduction efficiency, said filler being different from that of said semiconductor substrate and filled up at a portion of the spaces surrounding said bridge structures, said filler being disposed to enhance heat dissipation and to thereby allow a high power Gunn device operation.

15. The monolithic Gunn device array set forth in claim 13, further comprising a filler of material having dielectric constant different from that of said semiconductor substrate, said filler being disposed up at the refilling spaces surrounding said bridge structures to allow the oscillation of said Gunn devices to be suppressed.

* * * * *